(12) United States Patent
Buck et al.

(10) Patent No.: US 7,784,003 B2
(45) Date of Patent: Aug. 24, 2010

(54) ESTIMATION OF PROCESS VARIATION IMPACT OF SLACK IN MULTI-CORNER PATH-BASED STATIC TIMING ANALYSIS

(75) Inventors: Nathan C. Buck, Underhill, VT (US); John P. Dubuque, Jericho, VT (US); Eric A. Foreman, Fairfax, VT (US); Peter A. Habitz, Hinesburg, VT (US); Kerim Kalafala, Rhinebeck, NY (US); Jeffrey M. Ritzinger, Chippewa Falls, WI (US); Xiaoyue Wang, Kanata (CA)

(73) Assignee: International Business Machines Corporation, Armonk, NY (US)

( * ) Notice: Subject to any disclaimer, the term of this patent is extended or adjusted under 35 U.S.C. 154(b) by 763 days.

(21) Appl. No.: 11/679,171

(22) Filed: Feb. 26, 2007

(65) Prior Publication Data

US 2008/0209372 A1    Aug. 28, 2008

(51) Int. Cl.
*G06F 17/50*    (2006.01)

(52) U.S. Cl. ........................................................ 716/6
(58) Field of Classification Search .................. 716/1–6
See application file for complete search history.

(56) References Cited

U.S. PATENT DOCUMENTS

| | | | |
|---|---|---|---|
| 7,089,143 B2 | 8/2006 | Foreman et al. | |
| 7,117,466 B2 | 10/2006 | Kalafala et al. | |
| 2006/0288320 A1* | 12/2006 | Murgai et al. ................. | 716/6 |

* cited by examiner

*Primary Examiner*—Paul Dinh
(74) *Attorney, Agent, or Firm*—Downs Rachlin Martin PLLC

(57) ABSTRACT

A method and system for reducing a number of paths to be analyzed in a multi-corner static timing analysis. An estimated upper slack variation based on a non-common path delay for a racing path is utilized in determining if a multi-corner static timing analysis may be bypassed for a racing path. In another example, an estimated maximum RSS credit based on a total delay for a racing path is utilized in determining if a multi-corner static timing analysis may be bypassed for a racing path.

20 Claims, 4 Drawing Sheets

ESTIMATION OF PROCESS VARIATION IMPACT OF SLACK IN MULTI-CORNER PATH-BASED STATIC TIMING ANALYSIS

FIELD OF THE DISCLOSURE

The present disclosure generally relates to the field of static timing analysis. In particular, the present disclosure is directed to a multi-corner path-based static timing analysis.

BACKGROUND

Static timing analysis (STA) is utilized to verify integrated circuit design and analyze circuit performance. In circuit design, one signal may need to arrive at a particular point in a circuit path before another signal. A timing test with respect to a pair of timing test points is typically to compare two signals at the timing test point to determine whether a particular requirement on their relative arrival time is met. The difference of the relative arrival time of two signals at the timing test point is referred to as "slack". Two paths on which signals propagate to arrive at the pair of timing test points (e.g., clock and data pins of a flip-flop circuit) are often referred to as racing paths. Timing of integrated circuits may vary due to the effects of environmental and process variation. Typically, each source of variation to be analyzed is modeled as a parameter having an impact on a delay of a circuit path and/or a circuit. A set of parameter settings is often called a "corner." In one example, a parameter may be set to one of its extreme values (e.g., a 3SIGMA extreme value). In such an example, one corner provides a fastest signal propagation checked in a timing analysis and the other corner provides a slowest signal propagation in a timing analysis.

Multi-corner static timing analysis is utilized to verify integrated circuit designs across multiple process corners. Such a static timing analysis may start with a set of specific parameter values, called a starting corner. In such an analysis with n parameters, there may be $2^n$ extreme corners. As the number of parameters to test increases and the complexity of integrated circuit designs continues to grow, the analysis of the large number of extreme corners for each path of an integrated circuit becomes difficult, if not impossible, to perform in a reasonable amount of time. Reduction of the number of paths to analyze can reduce this time required to perform multi-corner timing analysis on remaining paths.

SUMMARY OF THE DISCLOSURE

In one embodiment, a computerized method of reducing a number of paths to be analyzed for a plurality of timing tests in a multi-corner static path-based timing analysis is provided. The method includes performing a first timing analysis on a plurality of paths to determine an initial corner path slack for each of the plurality of timing tests for each path of the plurality of paths; identifying a first set of racing path pairs of the plurality of paths that have a starting corner path slack that does not pass an initial threshold; determining an estimated upper slack variation for one or more racing path pair of the first set by utilizing a corresponding non-common path delay of the one or more racing path pair; applying the estimated upper slack variation for each of the racing path pairs of the first set to a corresponding initial corner path slack; bypassing full multi-corner path based static timing analysis for any racing path pair for which the result of the applying step is greater than or equal to a signoff slack; performing full multi-corner path based static timing analysis on each racing path pair for which the result of the applying step is less than the signoff slack; and outputting an indication of timing verification for one or more paths of an integrated circuit design.

In another embodiment, a computerized method of reducing a number of paths to be analyzed in a multi-corner static timing analysis is provided. The method includes running a timing analysis using a starting corner on a plurality of paths of an integrated circuit design to determine a first slack value for each timing test for each path of the plurality of paths; determining a first set of racing path pairs of the plurality of paths that have a first slack value that is below an initial threshold value and bypassing full multi-corner path-based static timing analysis for any racing path pairs of the plurality of paths that have a first slack value that is equal to or above the initial threshold value; applying a common path credit to each racing path of the first set to determine a post common path credit slack value for one or more racing path pair of the first set; determining a second set of racing path pairs from the first set that have a post common path credit slack value that is below a post common path credit threshold value and bypassing full multi-corner path-based static timing analysis for any racing path pair of the second set having a post common path credit slack value that is equal to or above the post common path credit threshold value; determining an estimated upper slack variation for each of one or more racing path pair of the second set by multiplying a path delay factor by a corresponding delay of a non-common path of the racing path pair; applying the estimated upper slack variation for each of the racing path pairs of the second set to a corresponding post common path credit slack value; bypassing full multi-corner path based static timing analysis for any racing path pair for which the result of the applying the estimated upper slack variation step is greater than or equal to a signoff slack; performing full multi-corner path based static timing analysis on one or more of any racing path pair for which the result of the applying the estimated upper slack variation step is less than the signoff slack; and outputting an indication of timing verification for one or more paths of the integrated circuit design In yet another embodiment, a computer readable medium containing computer executable instructions implementing a method of reducing a number of paths to be analyzed in a multi-corner static timing analysis is provided. The instructions include a set of instructions for performing a first timing analysis on a plurality of paths to determine an initial corner path slack for each of the plurality of timing tests for each path of the plurality of paths; a set of instructions for identifying a first set of racing path pairs of the plurality of paths that have a starting corner path slack that does not pass an initial threshold; a set of instructions for determining an estimated upper slack variation for one or more racing path pair of the first set by utilizing a corresponding non-common path delay of the one or more racing path pair; a set of instructions for applying the estimated upper slack variation for each of the racing path pairs of the first set to a corresponding initial corner path slack; a set of instructions for bypassing full multi-corner path based static timing analysis for any racing path pair for which the result of the applying step is greater than or equal to a signoff slack; and a set of instructions for performing full multi-corner path based static timing analysis on each racing path pair for which the result of the applying step is less than the signoff slack.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Embodiments of the present disclosure include a system and method for reducing a number of paths to be analyzed in a multi-corner static timing analysis. In one embodiment, a number of paths may be removed from full multi-corner static timing analysis by testing against an initial threshold. In another embodiment, a conservative bound on an expected multi-corner analysis slack value is obtained by computing a maximum expected slack penalty based on the non-common path latency. In yet another embodiment, an optimistic bound on the expected multi-corner analysis slack value is obtained by computing a maximum potential independently random delay RSS credit based on the non-common path latencies. Additional embodiments for reducing the number of paths to be analyzed are illustrated below with reference to FIGS. 1 to 4.

Figure 1:
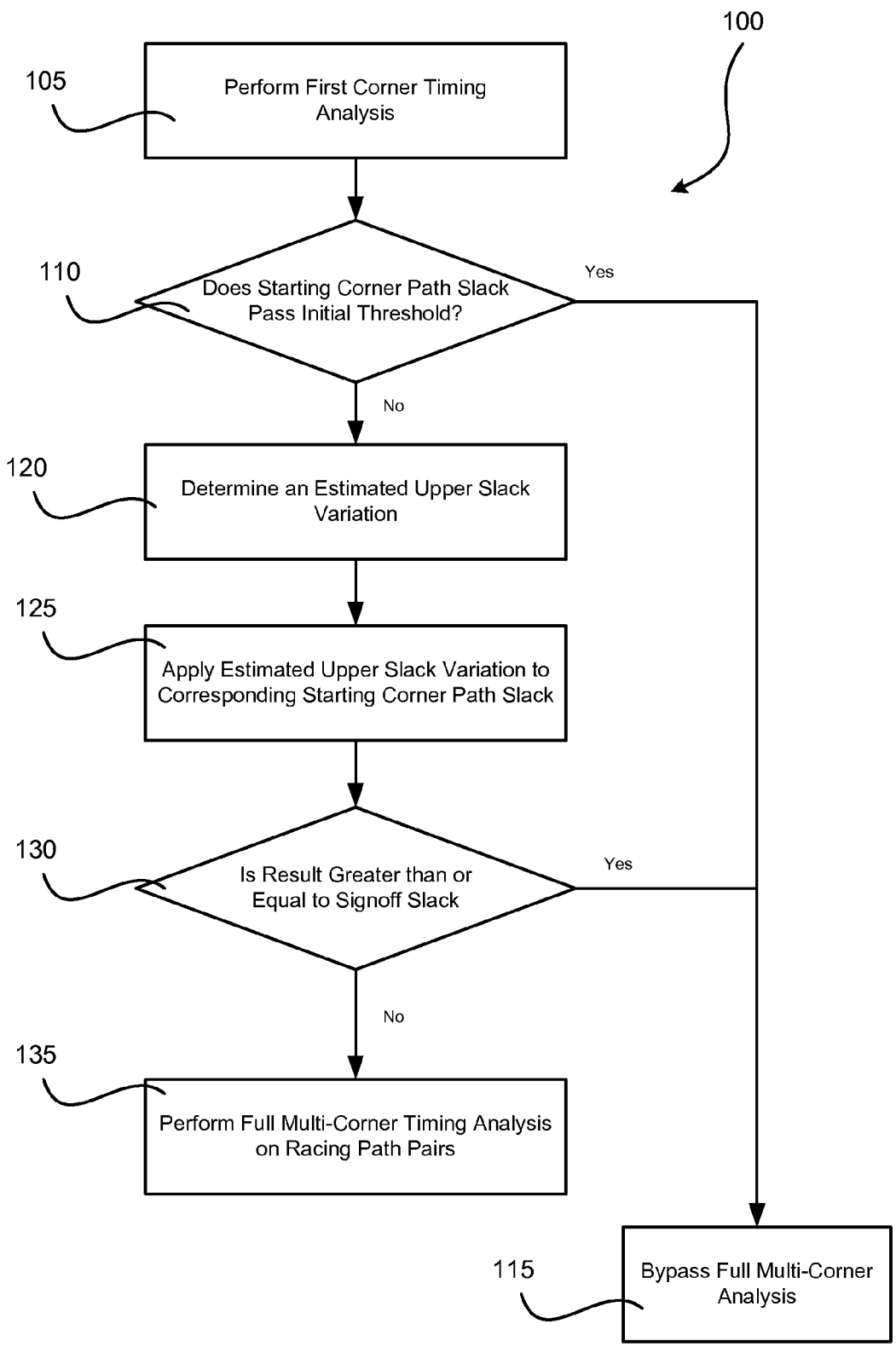
FIG. 1 illustrates one embodiment of a method for reducing the number of paths for timing analysis.

FIG. 1 illustrates one embodiment of a method 100. At step 105, a timing analysis is conducted utilizing a starting corner on paths of an integrated circuit. Timing analysis may be conducted using a timing analysis tool. Example timing analysis tools include, but are not limited to, EinsTimer available from International Business Machines and PrimeTime available from Synopsis. The starting corner may be any corner and is usually chosen to result in somewhat pessimistic slacks. In one example, a starting corner may be a corner that will give a slowest path delay in a worst case (WC) timing test. In another example, a starting corner may be a corner that will give a fastest path delay in a best case (BC) timing test. The timing analysis may include one or more levels of testing of the starting corner on the paths of the integrated circuit. In one example, a single analysis is performed on each racing path pair at the starting corner and a starting slack value is determined for each racing path pair. This starting slack value may then be utilized in step 110 (described below) to determine if a multi-corner timing analysis may be avoided for a particular racing path pair. In another example, a common path credit is applied to the starting slack value for each of the racing path pairs of the previous example for which multi-corner timing analysis was not determined to be avoidable. In yet another example, additional manipulations to the starting slack value may occur to further initially reduce the number of paths to be analyzed. Such examples are discussed further below with respect to FIG. 3.

At step 110, the starting slack value of step 105 (or a resultant slack value after a plurality of path reduction steps) is compared with a desired threshold. The desired threshold is typically a slack value below which a timing violation for a particular corner may exist. Each of the racing path pairs that passes in relation to this threshold may be bypassed in multi-corner timing analysis at step 115 (e.g., those racing path pairs that have a starting slack value that when compared to the threshold would indicate that they will pass all corners of a timing analysis). A threshold value is determined by an estimation of process and environmental variations. In one example, one of ordinary skill may estimate a particular threshold value based on given process and environmental conditions for a particular implementation. For example, if a threshold value is established at a value of x, racing path pairs that have a starting slack value greater than or equal to x can be bypassed in multi-corner timing analysis. In such an example, racing path pairs having a starting slack value less than x may be considered for further analysis (e.g., at step 120, discussed below). In an alternative example, where a threshold value is established at a value of y, racing path pairs that have a starting slack value that is greater than or equal to y can be bypassed in multi-corner timing analysis. In such an example, racing path pairs having a starting slack value less than y may be considered for further analysis.

At step 120, an estimated maximum slack variation value is determined for one or more racing path pairs that passed threshold comparison in step 110. An estimated upper slack variation value is an estimate of the maximum delta delay between two cells of an integrated circuit (e.g., a first cell at the beginning of one non-common path of a racing pair and a second cell at the end of the same non-common path of the racing pair) due to process and environmental variation. In one example, an estimated upper slack variation value is determined by the product of a non-common path delay and a path delay factor as in the following formula (1):

Estimated Maximum Slack Variation=Non-Common Path Delay*Path Delay Factor     (1)

Figure 2:
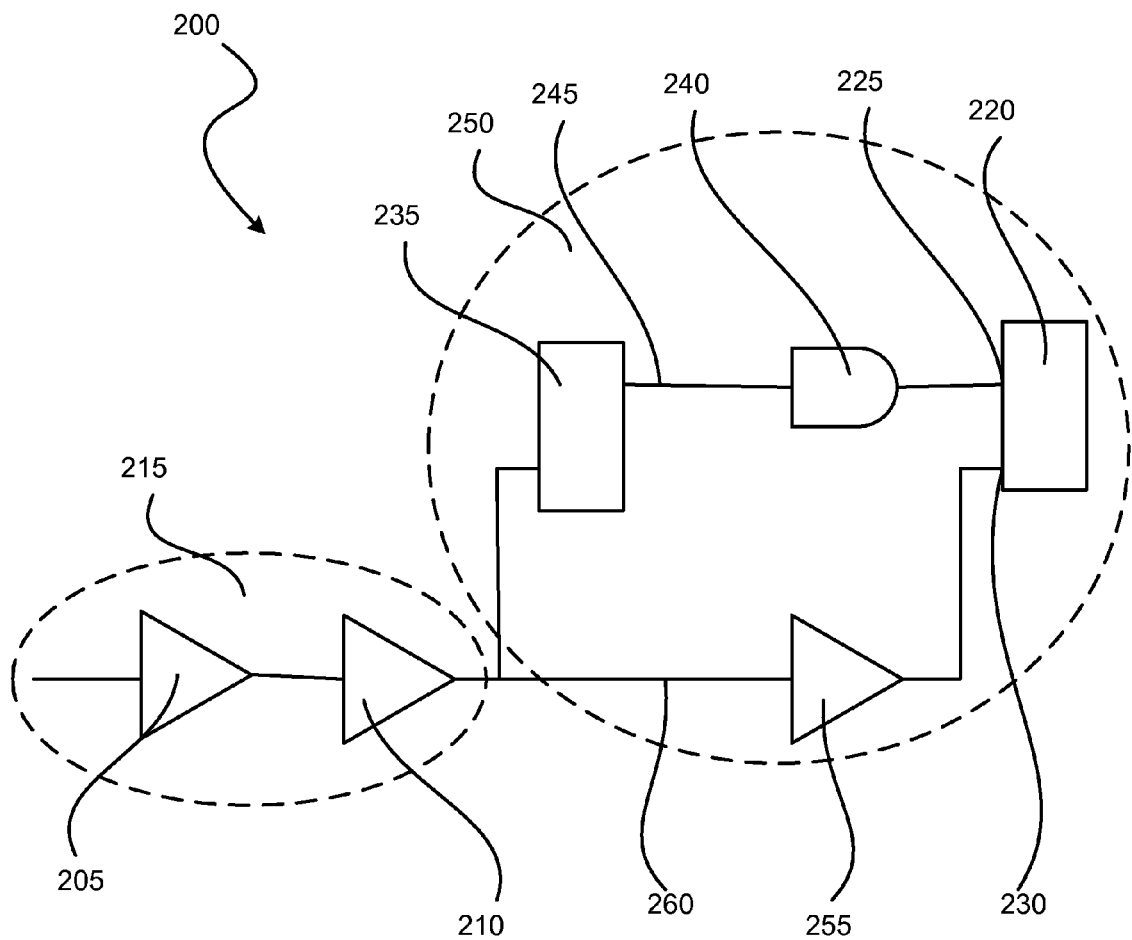
FIG. 2 illustrates one example of a portion of an integrated circuit design showing a common path and non-common paths.

A common path is a shared portion of two racing paths to be analyzed. A non-common path is a portion of a path that is not shared by both paths of a racing path pair. FIG. 2 illustrates an example of a portion of an integrated circuit 200. Integrated circuit 200 includes a circuit element 205 and a circuit element 210 that are part of a common path 215 of a racing path pair that end at a circuit element 220 (e.g., a flip-flop) having a cell 225 (e.g., an input pin) and a cell 230 (e.g., an input pin). Integrated circuit 200 also includes circuit elements 235 and 240 along one path 245 of a non-common path portion 250 of the racing path pair, and a circuit element 255 along another path 260 of non-common path portion 250. The delay on the non-common path is the delay attributable to one of the non-common paths of the racing paths. In one example, a non-common path delay may be a delay attributable to a non-common clock path. In another example, a non-common path delay may be a delay attributable to a non-common data path.

A path delay factor is a percentage value of the difference of the signal arrive times (i.e., the delay) between two cells of the same integrated circuit. In one example, a path delay factor may be determined by the estimation of the maximum delta delay between two cells due to process and environmental variation. In one example, a path delay factor may be about 30%. In another example, a path delay factor may be 30%. In yet another example, a path delay factor may be about 20%. In still another example, a path delay factor may be 20%.

At step 125 of FIG. 1, an estimated upper slack variation value for each racing path pair is applied to a corresponding starting corner slack value for that racing path pair. At step 130, the result of this application is compared with a signoff slack to determine if the result is greater than or equal to the signoff slack. In one example, the estimated upper slack variation value is applied to the starting corner slack value to determine if the final slack is worse than the signoff slack value. In another example, this comparison is performed by subtracting the estimated upper slack variation value from the starting corner slack. In such an example, a result of the application that is greater than or equal to the signoff slack value indicates that multi-corner analysis of the particular racing path pair may be bypassed at step 115. Racing path pairs that have a result of the application of the estimated upper slack variation value to the starting corner slack value that is less than the signoff slack value can be submitted for full multi-corner timing analysis at step 135. Steps 110 to 135 may be repeated until one or more paths (e.g., all paths) have been bypassed at step 115 or analyzed by full multi-corner timing analysis at step 135. A signoff slack is a slack value below which a timing violation will occur. Those of ordinary skill can determine a desired signoff slack value depending on a given implementation. In one example, a signoff slack value may be an industry standard signoff slack value. In another example, a signoff slack value may be zero. In yet another example, a signoff slack may include any user provided threshold value designed to predict timing violation.

One or more results of method 100 may include an indication of timing verification for one or more paths that have been analyzed with or without full multi-corner timing analysis at step 135. An indication of timing verification may be output during the implementation of method 100 and/or at the conclusion of implementation of method 100. Output of timing verification information may be in one or more of a variety of forms. Examples of an output include, but are not limited to, representation of an indicator of timing verification information as a displayable image (e.g., via a display device), representation of an indicator of timing verification information as a physical printout (e.g., via a printer of a computing device), transfer of a data element including an indicator of timing verification information (e.g., via an electrical connection, wired or wireless) to a device (e.g., a storage device, a remote computing device), and any combinations thereof.

Figure 3:
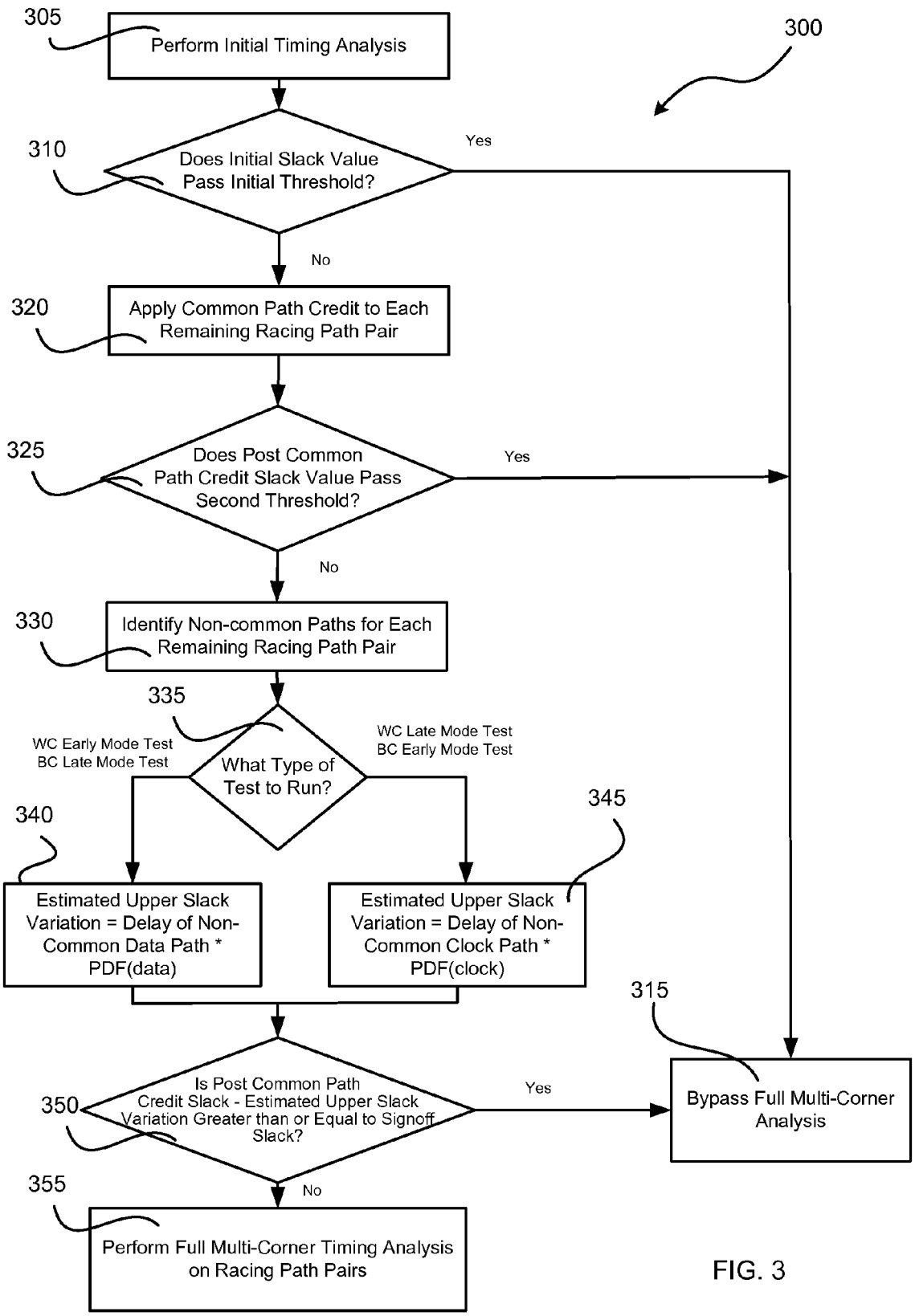
FIG. 3 illustrates another embodiment of a method for reducing the number of paths for timing analysis.

FIG. 3 illustrates yet another embodiment of a method 300. At step 305, a timing analysis is performed utilizing a starting corner as discussed above with respect to step 105 of FIG. 1. The resultant slack for each racing path pair tested in step 305 is compared with an initial threshold value to determine if the initial slack value is below the initial threshold. Derivation of threshold values was discussed above with respect to step 110 of FIG. 1. In one example, if the initial slack value for a racing path pair is greater than or equal to the initial threshold value, multi-corner timing analysis of that racing path pair may be bypassed at step 315. In such an example, if the initial slack value for a racing path pair is less than the initial threshold value, additional analysis of the racing path pair is performed at step 320.

At step 320, a common path credit is applied to each non-bypassed racing path pair to determine a post common path credit slack value for each racing path pair. A common path credit is defined herein below. A path in a circuit may have a short or longer delay due to variation of process and environment. In one example, a path that has a short delay is referred to as an early path. In another example, a path that has longer delay is referred to as a late path. In such an analysis, each set of racing paths may include an early path and a late path. A timing test may be a comparison between early and late arrival signals. If the two racing path leading to a test point have a common path as described above, the resultant slack may be unnecessarily pessimistic because it is not possible for a given circuit to have a given path that has two different sets of delays (early and late) at same time. The delta delay between late delay and early delay of a common path is referred to as a common path credit. In one example, a common path credit may be applied by running a common path pessimism removal (CPPR), as is known to those of ordinary skill, on each racing path pair to determine a post common path credit slack value for each racing path pair.

At step 325, the post common path credit slack value for each racing path pair is compared to the initial threshold value to determine if the post common path credit slack value is passes the initial threshold value. If the post common path credit slack value of a racing path pair passes the initial threshold (e.g., the post common path credit slack value is greater than or equal to the initial threshold), multi-corner timing analysis of that racing path pair may be bypassed at step 315. If the post common path credit slack value of a racing path pair does not pass the threshold value (e.g., the post common path credit slack value is less than the initial threshold, additional analysis of the racing path pair is performed at step 330.

In an alternative embodiment (not shown), an optional step may be implemented to further reduce the number of paths for full multi-corner analysis. This optional step may occur after step 325 and prior to step 330. In such an optional step, a maximum random-delay root-sum squared (RSS) credit is applied to each non-bypassed racing path pair to determine a post RSS credit slack value for the racing path pair. RSS credit is defined as below. A path in a circuit may consist of one or more cells (logic stage). Delay variation of a cell includes an independent random component. Since all cell delays are typically cumulative along the path in timing analysis, static timing analysis incorrectly assumes that in a given path the random variation would all tend to line up in same direction, i.e., incorrectly assumes that random delay of each cell along a path is either longer or shorter. Thus, the slack of the racing path pair is overly pessimistic. In order to alleviate this pessimism, once a specific path is selected for further analysis, an overall 3-Sigma probability distribution for path delay is determined by calculating the square root of the sum of the squares of the independently random delay along the path. In an example, there are n cells in a non-common path, $r_i$ is random delay of a cell i, D is the sum of the cell random delays along the non-common path $D_{rss}$ is the RSS random delay of all cells along the non-common path as in the following formula (2):

$$D_{rss} = \sqrt{\sum_{i=1}^{n} r_i^2} \quad (2)$$

RSS credit is equal to $D - D_{rss}$.

In one embodiment, a maximum RSS credit is computed by assuming that the entire delay is available for RSS credit, and that random delays in each circuit along the non-common paths under evaluation are identical. Under this optimistic assumption, the total delay of each circuit in the path may be scaled by:

$$\frac{1}{\sqrt{L_{max}}}$$

where L is the number of total stages of the logic in the path. The estimated RSS random delay $D_{rss}$ (estimate) along a non-common path is as in the following formula (3):

$$D_{rss}(\text{estimate}) = \frac{D_{rss}}{\sqrt{L_{max}}} \quad (3)$$

In such an example, the maximum RSS credit down along the non-common path is calculated by subtracting the $D_{rss}$ (estimate) from the sum of the total delay along the non-common path. Utilizing the maximum RSS credit may produce a further reduction in the number of paths for analysis. For example, if the post maximum credit slack value of a racing path pair is less than a signoff slack, the path will likely fail at full multi-corner analysis and no further timing analysis is required. As discussed above, a signoff slack is typically a slack value below which a timing violation for a particular corner exists.

At step 330, the non-common path delay for each remaining racing path pair is determined. At step 335, an estimated upper slack variation for each remaining racing path pair is determined based on the type of test desired. For example, for a worst case early mode test or a best case late mode test, an estimated upper slack variation may be determined from the product of a non-common data path delay and a data path delay factor at step 340. In another example, for a worst case late mode test or a best case early mode test, an estimated upper slack variation may be determined from the product of a non-common clock path delay and a clock path delay factor at step 345. An early mode test is to determine a slack at a test point between an early signal along with an early path of a racing path pair and a late signal along with a late path of the racing path pair (late-early). A late mode test is to determine a slack between a late signal along with a late path of a racing path pair and an early signal along with an early path of the racing path pair (early-late).

At step 350, the estimated upper slack variation for each racing path pair is applied to a corresponding post common path credit slack value to determine if the result is greater than a signoff slack value. In one example, the application includes subtracting the estimated upper slack variation from the corresponding post common path credit slack value. If the result of the application for a racing path pair is greater than or equal to the signoff value, full multi-corner timing analysis may be bypassed at step 315. If the result of the application for a racing path pair is less than to the signoff value, multi-corner timing analysis is performed on the racing path pair at step 355. Steps 310 to 355 may be repeated for each of racing path pair to be tested.

It is contemplated that one of ordinary skill in the art can extend and apply the aspects of the embodiments described herein to examples beyond those described above with respect to FIGS. 1 to 3. For example, although a small circuit is described above, the concepts described herein apply to circuits of any size. In another example, although for purposes of clarity, rising and falling timing quantities are not herein differentiated, one of ordinary skill can easily apply the concepts to various situations including, but not limited to, those with different rising and falling delays, slews, arrive times (AT), required arrive times (RAT), and any combinations thereof. In yet another example, the concepts described herein may be applied to any type of static timing, including, but not limited to, static timing of a gate-level circuit, a transistor-level circuit, a hierarchical circuit, a circuit with combinational logic, a circuit with sequential logic, timing in the presence of a multiple-input switching, timing in the presence of an arbitrary timing test (e.g., setup, hold, end-of-cycle, pulse width, clock gating, loop-cut), timing in the presence of multiple clock domains, and any combinations thereof.

With respect to FIG. 1, it is contemplated that a different path delay factor may be applied based on one or more characteristics of a timing test under consideration (e.g., a setup test and a delay test may utilize different path delay factors). With respect to FIG. 3, it is contemplated that an estimation of an RSS credit may be extended in a variety of ways by those of ordinary skill including, but not limited to, the extension of applying a multiplicative factor to each delay (e.g., for the purpose of estimating the maximum overall RSS credit).

It is to be noted that the aspects and embodiments described herein may be conveniently implemented using one or more machines (e.g., a general purpose computing device) programmed according to the teachings of the present specification, as will be apparent to those of ordinary skill in the computer art. For example, various aspects of a method of reducing a number of paths for timing analysis, such as methods 100, 300, may be implemented as machine-executable instructions (i.e., software coding), such as program modules executed by one or more machines. Typically a program module may include routines, programs, objects, components, data structures, etc. that perform specific tasks. Appropriate machine-executable instructions can readily be prepared by skilled programmers based on the teachings of the present disclosure, as will be apparent to those of ordinary skill in the software art.

Such software may be a computer program product that employs a machine-readable medium. A machine-readable medium may be any medium that is capable of storing and/or encoding a sequence of instructions for execution by a machine (e.g., a general purpose computing device) and that causes the machine to perform any one of the methodologies and/or embodiments described herein. Examples of a machine-readable medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory.

Examples of a general purpose computing device include, but are not limited to, a computer workstation, a terminal computer, a server computer, a handheld device (e.g., tablet computer, a personal digital assistant "PDA", a mobile telephone, etc.), a web appliance, a network router, a network switch, a network bridge, any machine capable of executing a sequence of instructions that specify an action to be taken by that machine, and any combinations thereof. In one example, a general purpose computing device may include and/or be included in, a kiosk.

Figure 4:
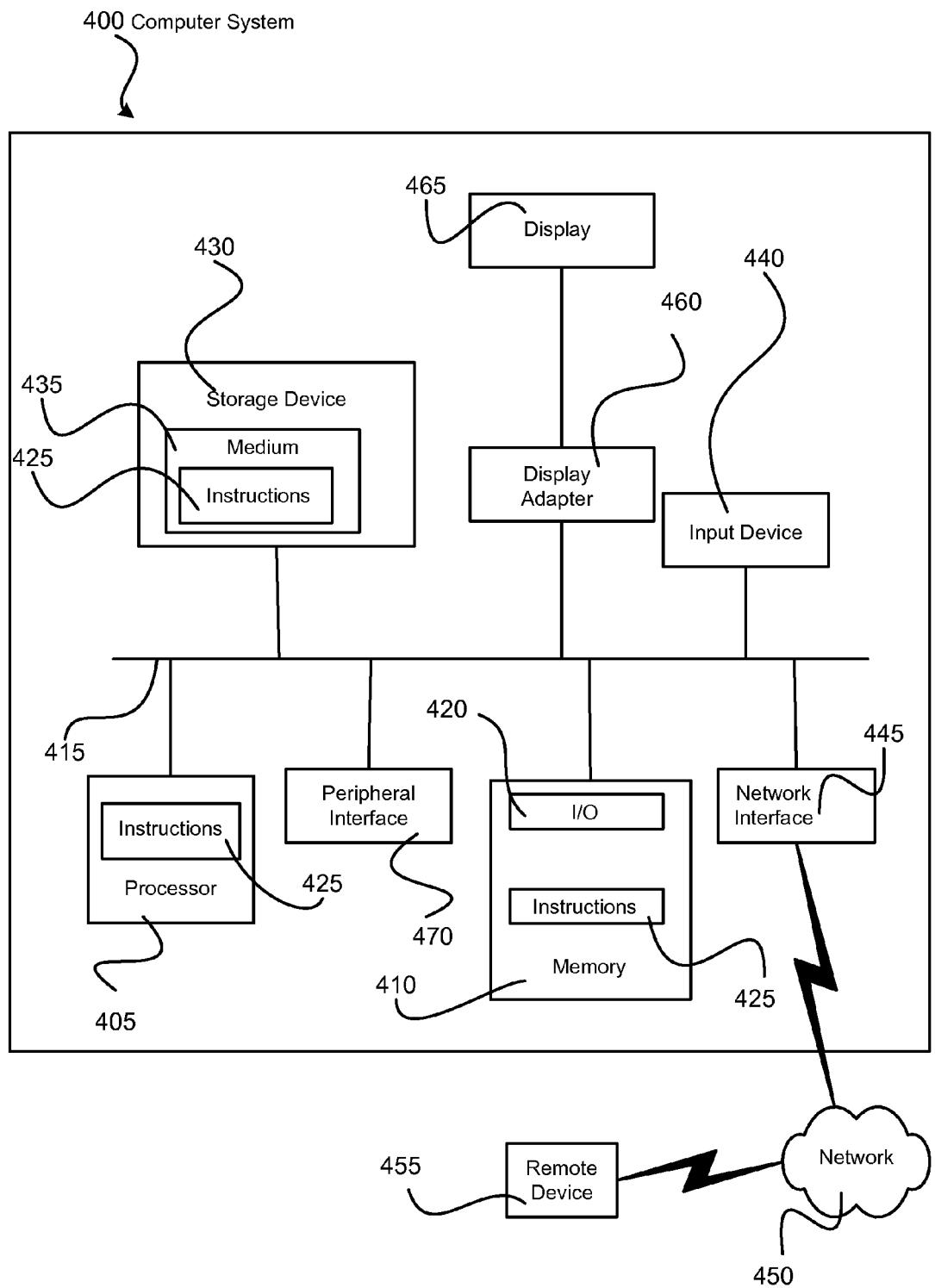
FIG. 4 illustrates an exemplary computing environment in which a system and/or method for reducing the number of paths for timing analysis may be employed.

FIG. 4 shows a diagrammatic representation of one embodiment of a general purpose computing device in the exemplary form of a computer system 400 within which a set of instructions for causing the device to perform any one or more of the aspects and/or methodologies of the present disclosure may be executed. Computer system 400 includes a processor 405 and a memory 410 that communicate with each other, and with other components, via a bus 415. Bus 415 may include any of several types of bus structures including, but not limited to, a memory bus, a memory controller, a peripheral bus, a local bus, and any combinations thereof, using any of a variety of bus architectures.

Memory 410 may include various components (e.g., machine readable media) including, but not limited to, a random access memory component (e.g., a static RAM "SRAM", a dynamic RAM "DRAM", etc.), a read only component, and any combinations thereof. In one example, a basic input/output system 420 (BIOS), including basic routines that help to transfer information between elements within computer system 400, such as during start-up, may be stored in memory 410. Memory 410 may also include (e.g., stored on one or more machine-readable media) instructions (e.g., software) 425 embodying any one or more of the aspects and/or methodologies of the present disclosure. In another example, memory 410 may further include any number of program modules including, but not limited to, an operating system, one or more application programs, other program modules, program data, and any combinations thereof.

Computer system 400 may also include a storage device 430. Examples of a storage device (e.g., storage device 430) include, but are not limited to, a hard disk drive for reading from and/or writing to a hard disk, a magnetic disk drive for reading from and/or writing to a removable magnetic disk, an optical disk drive for reading from and/or writing to an optical media (e.g., a CD, a DVD, etc.), a solid-state memory device, and any combinations thereof. Storage device 430 may be connected to bus 415 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 430 may be removably interfaced with computer system 400 (e.g., via an external port connector (not shown)). Particularly, storage device 430 and an associated machine-readable medium 435 may provide nonvolatile and/or volatile storage of machine-readable instructions, data structures, program modules, and/or other data for computer system 400. In one example, software 425 may reside, completely or partially, within machine-readable medium 435. In another example, software 425 may reside, completely or partially, within processor 405.

Computer system 400 may also include an input device 440. In one example, a user of computer system 400 may enter commands and/or other information into computer system 400 via input device 440. Examples of an input device 440 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), touchscreen, and any combinations thereof. Input device 440 may be interfaced to bus 415 via any of a variety of interfaces (not shown) including, but not limited to, a serial interface, a parallel interface, a game port, a USB interface, a FIREWIRE interface, a direct interface to bus 415, and any combinations thereof.

A user may also input commands and/or other information to computer system 400 via storage device 430 (e.g., a removable disk drive, a flash drive, etc.) and/or a network interface device 445. A network interface device, such as network interface device 445 may be utilized for connecting computer system 400 to one or more of a variety of networks, such as network 450, and one or more remote devices 455 connected thereto. Examples of a network interface device include, but are not limited to, a network interface card, a modem, and any combination thereof. Examples of a network or network segment include, but are not limited to, a wide area network (e.g., the Internet, an enterprise network), a local area network (e.g., a network associated with an office, a building, a campus or other relatively small geographic space), a telephone network, a direct connection between two computing devices, and any combinations thereof. A network, such as network 450, may employ a wired and/or a wireless mode of communication. In general, any network topology may be used. Information (e.g., data, software 425, etc.) may be communicated to and/or from computer system 400 via network interface device 445.

Computer system 400 may further include a video display adapter 460 for communicating a displayable image to a display device, such as display device 465. Examples of a display device include, but are not limited to, a liquid crystal display (LCD), a cathode ray tube (CRT), a plasma display, and any combinations thereof. In addition to a display device, a computer system 400 may include one or more other peripheral output devices including, but not limited to, an audio speaker, a printer, and any combinations thereof. Such peripheral output devices may be connected to bus 415 via a peripheral interface 470. Examples of a peripheral interface include, but are not limited to, a serial port, a USB connection, a FIREWIRE connection, a parallel connection, and any combinations thereof.

A digitizer (not shown) and an accompanying pen/stylus, if needed, may be included in order to digitally capture freehand input. A pen digitizer may be separately configured or coextensive with a display area of display device 465. Accordingly, a digitizer may be integrated with display device 465, or may exist as a separate device overlaying or otherwise appended to display device 465.

In one exemplary aspect, a method of reducing a number of paths for multi-corner timing analysis, such as methods 100 and 300, may significantly reduce the runtime of a multi-corner timing analysis (e.g., by a 2× reduction in runtime). In another exemplary aspect, the coverage of a timing analysis in an integrated circuit may be increased by raising the initial threshold (e.g., at steps 110 of FIG. 1 and/or 310 of FIG. 3). A greater initial threshold is possible due to the decreased runtime of the multi-corner analysis that may be the result of a method, such as methods 100 and 300. In another exemplary aspect, the greater the number of paths in an integrated circuit design, the greater the potential reduction in runtime that may be achieved. In one experimental example of an application of a method of reducing the runtime of a multi-corner timing analysis (e.g., method 100), significant runtime improvement was achieved with the utilization of a method employing an estimated upper slack variation utilization over a method lacking the utilization of an estimated upper slack variation. In this example, integrated circuit 1 is less complicated than integrated circuit 2 (i.e., there are more paths to be analyzed in integrated circuit 2), which is less complicated than integrated circuit 3). In such an example, the following results were obtained:

|  | Runtime without Estimated Upper Slack Variation | Runtime with Estimated Upper Slack Variation |
| --- | --- | --- |
| Integrated Circuit 1 | 1.8 hours | 1.3 hours |
| Integrated Circuit 2 | 6.25 hours | 3.3 hours |
| Integrated Circuit 3 | 15 hours | 7.3 hours |

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A computerized method of reducing a number of paths to be analyzed for a plurality of timing tests in a multi-corner static path-based timing analysis, the method comprising:

using one or more computers to perform the steps of:
performing a first timing analysis on a plurality of paths to determine an starting corner path slack for each of the plurality of timing tests for each path of the plurality of paths;
identifying a first set of racing path pairs of the plurality of paths that have a starting corner path slack that does not pass an initial threshold;
determining an estimated upper slack variation for one or more racing path pair of the first set by utilizing a corresponding non-common path delay of the one or more racing path pair, wherein the non-common path delay is a delay related to a portion of a path not shared by both paths of a racing path pair;
applying the estimated upper slack variation for each of the racing path pairs of the first set to a corresponding starting corner path slack;
bypassing full multi-corner path based static timing analysis for any racing path pair for which the result of said applying step is greater than or equal to a signoff slack;
performing full multi-corner path based static timing analysis on each racing path pair for which the result of said applying step is less than the signoff slack; and
outputting an indication of timing verification for one or more paths of an integrated circuit design.

2. A computerized method according to claim 1, wherein said performing of a first timing analysis and said identifying of a first set comprise:
running a timing analysis using the starting corner on the plurality of paths to determine a starting corner slack value for each timing test;
determining a second set of racing path pairs of the plurality of paths that have a starting corner slack value that is below a starting corner threshold value;
applying a common path credit to one or more racing paths of the second set to determine a post common path credit slack value for each of the one or more racing path pair of the second set;
determining a third set of racing path pairs from said second set that have a post common path credit slack value that is below a post-common path credit threshold value; and
including in the first set of racing path pairs each of the racing path pairs of the third set, wherein the post common path credit slack value is the starting corner path slack.

3. A computerized method according to claim 2, further comprising:
estimating a maximum random-delay root-sum squared ("RSS") credit due to statistical independent random delay;
applying the maximum RSS credit to said post common path credit slack value; and
bypassing full-multi-corner path based static timing analysis for any racing path pair for which the result of said applying the maximum RSS credit step is less than a user-specified threshold value.

4. A computerized method according to claim 3, wherein said maximum RSS credit is determined by subtracting an estimated Root-Sum-Squared random delay from a total delay along a path, the estimated Root-Sum-Squared random delay determined by dividing the total delay by the square root of the logic depth of the corresponding racing path pair.

5. A computerized method according to claim 1, wherein said determining an estimated upper slack variation comprises multiplying a path delay factor by a delay of a non-common path of a racing path pair.

6. A computerized method according to claim 5, wherein said non-common path is a non-common clock path.

7. A computerized method according to claim 5, wherein said non-common path is a non-common data path.

8. A computerized method according to claim 5, wherein said path delay factor is about 30%.

9. A computerized method according to claim 1, wherein said applying the estimated upper slack variation comprises subtracting the estimated upper slack variation from the corresponding starting corner path slack.

10. A computerized method of reducing a number of paths to be analyzed in a multi-corner static timing analysis, the method comprising:

using one or more computers to perform the steps of:
running a timing analysis using a starting corner on a plurality of paths of an integrated circuit design to determine a first slack value for each timing test for each path of the plurality of paths;
determining a first set of racing path pairs of the plurality of paths that have a first slack value that is below an initial threshold value and bypassing full multi-corner path-based static timing analysis for any racing path pairs of the plurality of paths that have a first slack value that is equal to or above the initial threshold value;
applying a common path credit to each racing path of the first set to determine a post common path credit slack value for one or more racing path pair of the first set;
determining a second set of racing path pairs from said first set that have a post common path credit slack value that is below a post common path credit threshold value and bypassing full multi-corner path-based static timing analysis for any racing path pair of the second set having a post common path credit slack value that is equal to or above the post common path credit threshold value;
determining an estimated upper slack variation for each of one or more racing path pair of the second set by multiplying a path delay factor by a corresponding delay of a non-common path of the racing path pair, wherein the non-common path delay is a delay related to a portion of a path not shared by both paths of a racing path pair;
applying the estimated upper slack variation for each of the racing path pairs of the second set to a corresponding post common path credit slack value;
bypassing full multi-corner path based static timing analysis for any racing path pair for which the result of said applying the estimated upper slack variation step is greater than or equal to a signoff slack;
performing full multi-corner path based static timing analysis on one or more of any racing path pair for which the result of said applying the estimated upper slack variation step is less than the signoff slack; and
outputting an indication of timing verification for one or more paths of the integrated circuit design.

11. A computerized method according to claim 10, further comprising:
- estimating a maximum random-delay root-sum squared ("RSS") credit due to statistical independent random delay;
- applying the maximum RSS credit to said post common path credit slack value; and
- bypassing full-multi-corner path based static timing analysis for any racing path pair for which the result of said applying the maximum RSS credit step is less than a user-specified threshold value.

12. A computer readable medium containing computer executable instructions, the computer executable instructions, when executed by a computer, implementing a method of reducing a number of paths to be analyzed in a multi-corner static timing analysis, the instructions comprising:
- a set of instructions for performing a first timing analysis on a plurality of paths to determine an starting corner path slack for each of the plurality of timing tests for each path of the plurality of paths;
- a set of instructions for identifying a first set of racing path pairs of the plurality of paths that have a starting corner path slack that does not pass an initial threshold;
- a set of instructions for determining an estimated upper slack variation for one or more racing path pair of the first set by utilizing a corresponding non-common path delay of the one or more racing path pair, wherein the non-common path delay is a delay related to a portion of a path not shared by both paths of a racing path pair;
- a set of instructions for applying the estimated upper slack variation for each of the racing path pairs of the first set to a corresponding starting corner path slack;
- a set of instructions for bypassing full multi-corner path based static timing analysis for any racing path pair for which the result of said applying step is greater than or equal to a signoff slack; and
- a set of instructions for performing full multi-corner path based static timing analysis on each racing path pair for which the result of said applying step is less than the signoff slack.

13. A computer readable medium according to claim 12, wherein said instructions for performing of a first corner timing analysis and said instructions for identifying of a first set comprise:
- a set of instructions for running a timing analysis using the starting corner on the plurality of paths to determine a starting corner slack value for each timing test;
- a set of instructions for determining a second set of racing path pairs of the plurality of paths that have a starting corner slack value that is below a starting corner threshold value;
- a set of instructions for applying a common path credit to one or more racing paths of the second set to determine a post common path credit slack value for each of the one or more racing path pair of the second set;
- a set of instructions for determining a third set of racing path pairs from said second set that have a post common path credit slack value that is below a post-common path credit threshold value; and
- a set of instructions for including in the first set of racing path pairs each of the racing path pairs of the third set, wherein the post common path credit slack value is the starting corner path slack.

14. A computer readable medium according to claim 13, further comprising:
- a set of instruction for estimating a maximum random-delay root-sum squared ("RSS") credit due to statistical independent random delay; and
- a set of instruction for applying the maximum RSS credit to said post common path credit slack value.

15. A computer readable medium according to claim 14, wherein said set of instructions for estimating a maximum RSS credit includes a set of instructions for subtracting an estimated Root-Sum-Squared random delay from a total delay along a path, the estimated Root-Sum-Squared random delay determined by dividing the total delay by the square root of the logic depth of the path.

16. A computer readable medium according to claim 12, wherein said instructions for determining an estimated upper slack variation comprises a set of instructions for multiplying a path delay factor by a delay of a non-common path of a racing path pair.

17. A computer readable medium according to claim 16, wherein said non-common path is a non-common clock path.

18. A computer readable medium according to claim 16, wherein said non-common path is a non-common data path.

19. A computer readable medium according to claim 16, wherein said path delay factor is about 30%.

20. A computer readable medium according to claim 12, wherein said instructions for applying the estimated upper slack variation comprises a set of instructions for subtracting the estimated upper slack variation from the corresponding starting corner path slack.

* * * * *